(12) United States Patent
Peigat et al.

(10) Patent No.: US 9,465,895 B2
(45) Date of Patent: Oct. 11, 2016

(54) METHOD FOR ESTIMATING THE THIGHTNESS OF A SEAL

(75) Inventors: Laurent Peigat, Soyaux (FR); Jacques Besson, Samois sur Seine (FR); Magali Reytier, Villard de Lans (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 480 days.

(21) Appl. No.: 14/003,653

(22) PCT Filed: Mar. 9, 2012

(86) PCT No.: PCT/EP2012/054157
§ 371 (c)(1),
(2), (4) Date: Jan. 9, 2014

(87) PCT Pub. No.: WO2012/120133
PCT Pub. Date: Sep. 13, 2012

(65) Prior Publication Data
US 2014/0129191 A1   May 8, 2014

(30) Foreign Application Priority Data

Mar. 10, 2011 (FR) ..................................... 11 51964

(51) Int. Cl.
*G06F 17/50* (2006.01)
(52) U.S. Cl.
CPC ....... *G06F 17/5009* (2013.01); *G06F 17/5018* (2013.01)
(58) Field of Classification Search
USPC ........................................................ 703/2, 7
See application file for complete search history.

(56) References Cited

U.S. PATENT DOCUMENTS

2005/0249996 A1   11/2005   Meacham

FOREIGN PATENT DOCUMENTS

WO    WO 95/26054 A2   9/1995
WO    WO 95/26054 A3   9/1995

OTHER PUBLICATIONS

French Preliminary Search Report issued Jan. 23, 2012 in Patent Application No. 1151964 with English translation of categories of cited documents.
P. Bérard, et al., "Viscoplastic behavior of a FeCrAl alloy for high temperature steam electrolysis (HTSE) sealing applications between 700° C. and 900° C.", Materials Science and Engineering A, vol. 528, 2011, pp. 4092-4097.
Yeong-shyung Chou, et al., "Thermal cycling and degradation mechanisms of compressive mica-based seals for solid oxide fuel cells", Journal of Power Sources, vol. 112, 2002, pp. 376-383.
(Continued)

*Primary Examiner* — Thai Phan
(74) *Attorney, Agent, or Firm* — Oblon, McClelland, Maier & Neustadt, L.L.P.

(57) ABSTRACT

A method for estimating a seal of a gasket, including: digitally simulating, using a computer, a creep deformation of a gasket resulting from crushing of the gasket between two bearing surfaces; calculating, at an interface between the gasket and one of the two bearing surfaces and during the computer simulation, a cumulative plastic deformation of the gasket, an axial stress between the gasket and the one the two bearing surfaces, and a contact length between the gasket and the one of the two bearing surfaces; and calculating a simulated porosity filling coefficient, representing the seal of the gasket at the interface.

11 Claims, 9 Drawing Sheets

(56) References Cited

OTHER PUBLICATIONS

Figure 1:
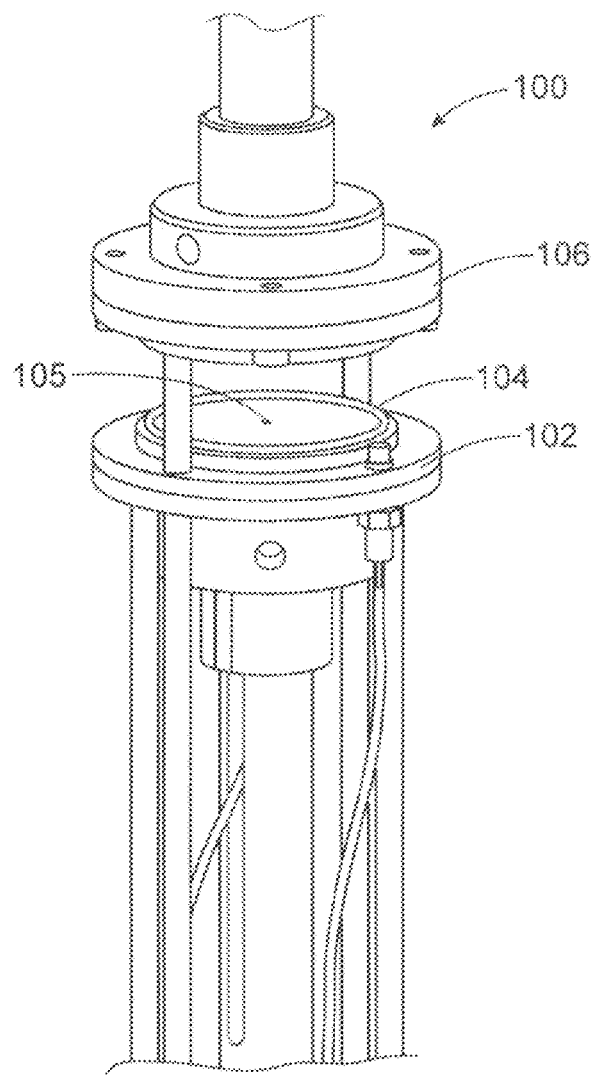

Jean Duquette, et al., "Silver wire seal design for planar solid oxide fuel cell stack", Journal of Power Sources, vol. 137, 2004, pp. 71-75.

Jeffrey W. Fergus, "Sealants for solid oxide fuel cells", Journal of Power Sources, vol. 147, 2005, pp. 46-57.

K. Scott Weil, et al., "Alternative planar SOFC sealing concepts", Fuel Cells Bulletin, vol. 2004, Issue 5, May 2004, pp. 11-16.

International Search Report issued Apr. 12, 2012, in PCT/EP2012/054157.

V. A. Anikeenko, et al., "Leak Tightness of Detachable Joints With Heat-Expanded Graphite Gaskets", Chemical and Petroleum Engineering, vol. 43, Nos. 11-12, XP 019570684, Nov. 2007, pp. 740-743.

Corijn H.C. Snippe, et al., "Prediction of Gas Leak Tightness of Superplastically Formed Products", Air Conference Proceedings American Institute of Physics USA, vol. 1252, XP 002666852, 2010, pp. 818-825.

Hildegard Zerres, et al., "Present calculation methods dedicated to bolted flanged connections", International Journal of Pressure Vessels and Piping, vol. 81, No. 2, XP 055016100, Feb. 2004, pp. 211-216.

Christophe Marie, et al., "Experimental Leak-Rate Measurement Through a Static Metal Seal", Journal of Fluids Engineering, vol. 129, No. 6, XP 009155330, Jun. 2007, pp. 799-805.

C. Marie, et al., "An integrated Approach to Characterize Liquid Leakage Through Metal Contact Seal", European Journal of Mechanical and Environmental Engineering, vol. 48, No. 2, XP 009155329, Jun. 2003, pp. 81-86.

METHOD FOR ESTIMATING THE THIGHTNESS OF A SEAL

TECHNICAL FIELD

The invention relates to a method for estimating the tightness of a seal, or gasket. This method notably applies to all seals used at high temperature, and will be particularly advantageous to estimate the tightness of seals intended to be used in a high-temperature electrolyser (HTE), between an electrochemical cell and a metal interconnector of the electrolyser.

STATE OF THE PRIOR ART

A high-temperature electrolyser is an electrochemical system intended to produce hydrogen from electrolysis of steam undertaken at a temperature of between approximately 600° C. and 1000° C. It notably consists of electrochemical cells, generally made of ceramic material, and of stacked metal interconnectors. Spaces formed between the cells and the interconnectors form chambers containing gases (hydrogen and oxygen) resulting from the electrolysis reaction. To prevent recombination between the hydrogen and oxygen formed, which may occur when these gases blend, and also to prevent leaks of these gases outside the system, these chambers must be tight.

The advantage of such an electrolyser of the HTE type is that it does not cause any emission of $CO_2$ and has an efficiency which is theoretically better than that of a traditional low-temperature electrolyser, since a proportion of the energy required for the electrolysis is provided in the form of heat and not solely in the form of electricity.

One goal of this technology is to produce electrolysers coupled with heat sources of nuclear, geothermal or again solar origin. However, management of the gases (steam, hydrogen and oxygen), and maintenance of tightness over time are major problems for the production of such electrolysers. Indeed, tightness must be produced between materials of different natures (ceramic and metal), and must be effective at high temperature. However, a ceramic electrochemical cell is fragile and has a thermal expansion coefficient significantly below that of a metal interconnector. The tight connections to be produced must therefore be produced under a small load, so that they do not cause excessive mechanical stress to the electrochemical cell, and must be sufficiently flexible to withstand the expansion differential, and must also have satisfactory creep endurance to ensure that tightness is maintained over a long period at high temperature.

The reference solutions to produce such tightness in an HTE electrolyser consist in using seals made of glass in the pasty state. However, use of this type of seal has a number of disadvantages. Indeed, although during nominal operation of the electrolyser the properties of these seals are generally suitable, problems appear during the transient regimes, i.e. during the heating and cooling phases. Indeed, a glass seal is fragile below its glass transition temperature and may fracture if it is subjected to stress at such a temperature, notably due to differential expansions appearing between the interconnectors and the electrochemical cells. Such a seal then creates a rigid connection between the elements of the electrolyser, generating stresses during the thermal transient regimes. In addition, when the tightness is produced by such seals, it is difficult, or impossible, to disassemble the components of the cell unless the cell is completely changed. The vertical position of such seals may also pose problems, since the glass may then flow, reduce the lifetime of the assembly, and not tolerate the pressure levels of several bars found in an industrial high-temperature electrolyser. Finally, the types of glass used to produce these seals may not be chemically compatible with the other components of the cell and of the interconnector, which may lead to substantial corrosion of the seal surfaces or again silicon pollution of the electrodes of the HTE.

Another solution to produce the tightness between the ceramic cells and the metal interconnectors consists in soldering the metal of the interconnector directly on to the ceramic.

However, the fact that wetting of the interconnector is obtained on the ceramic, together with the thermal expansion differences between these elements, make this operation very difficult, notably when it is undertaken on large-dimension elements, where cooling after solidification of the solder generally causes the ceramic to fracture if no flexibility has been introduced into the structure of the interconnector.

It is also known to use other types of compression seals made of mica or simply metal. However, such seals require external clamping, which must be controlled and maintained at temperature to obtain effective tightness without fracturing the cell in the course of heating. There is thus a need to improve these compression seals with a view to improving tightness between the ceramic cells and the metal interconnectors of an HTE electrolyser.

DESCRIPTION OF THE INVENTION

One aim of the present invention is to propose a method enabling the tightness of a seal to be estimated a priori, by calculation, in order to be able to optimise the structure of this seal without having actually to measure this tightness each time the structure of the seal is modified.

To this end, a method for estimating the tightness of a seal is proposed, comprising at least the following steps:
digital simulation of a deformation by creep of the seal by compression of the seal between two surfaces, or bearing surfaces,
calculation, at at least one interface between the seal and one of the two surfaces, of a cumulative plastic deformation p of the seal, of an axial stress Smzz between the seal and said one of the two surfaces, and of a contact length Lc between the seal and said one of the two surfaces, during the digital simulation,
calculation of a simulated pore plugging coefficient $F_{num}$, representative of the tightness of the seal at said interface between the seal and said one of the two surfaces, such that:

$$F_{num} = \int_{ri}^{re} \int_{p} \lambda \cdot \left(\frac{Smzz}{\sigma_{seuil}}\right)^{\alpha} \cdot \left(\frac{p}{p_0}\right)^{\beta} dp \frac{dr}{r},$$

where
$\lambda$, $\alpha$ and $\beta$: coefficients the values of which depend on the seal material $Lc=re-ri, m$ Smzz: axial stress, MPa
$\sigma_{seuil}$: threshold stress equal to 1 MPa
p: cumulative plastic deformation
$p_0$: constant equal to 1.

The present invention notably relates to a method for estimating the tightness of a seal, comprising at least the following steps:

- digital simulation by computer of a deformation by creep of the seal by compression of the seal between two surfaces,
- calculation, at at least one interface between the seal and one of the two surfaces, of a cumulative plastic deformation p of the seal, of an axial stress Smzz between the seal and said one of the two surfaces, and of a contact length Lc between the seal and said one of the two surfaces, during the digital simulation,
- calculation of a simulated pore plugging coefficient $F_{num}$, representative of the tightness of the seal at said interface between the seal and said one of the two surfaces, such that:

$$F_{num} = \int_{ri}^{re} \int_{0}^{pmax} \lambda \cdot \left(\frac{Smzz}{\sigma_{seuil}}\right)^{\alpha} \cdot \left(\frac{p}{p_0}\right)^{\beta} dp \frac{dr}{r},$$

where $\lambda$, $\alpha$ and $\beta$: coefficients the values of which depend on the seal material, re and ri: respectively the external radius and the internal radius of the deformation of the seal, m, r: position along the contact between the seal and said at least one of the two surfaces, Lc=re−ri,m, Smzz: axial stress, MPa, $\sigma_{seuil}$: threshold stress equal to 1 MPa, p: cumulative plastic deformation, pmax: maximum value attained by p during the simulation, $p_0$: constant equal to 1.

This method enables to estimate, a priori, the quality of tightness of a seal, and its quality to be maintained over time notably on the basis of the geometrical characteristics of the seal. It is thus possible to develop and qualify new seals, for example metal seals for a high-temperature electrolyser, and to check whether the tightness obtained enables an acceptable leak to be obtained, for example less than or equal to approximately $10^{-3}$ Nml/min./mm in the case of a seal for a high-temperature electrolyser, without requiring that tests and measurements are made on the seal. This method notably enables new tightness solutions to be proposed for a high-temperature electrolyser, by determining a schedule of specifications which a seal should satisfy in order to have a leak as small as possible, where the leak is minimised when it is sought to maximise term $F_{num}$.

The mechanical properties of the seal and of the surfaces will be able to be identified in order to perform the simulations. The seal may have viscoplastic characteristics and may be deformed by creep between the two surfaces, the characteristics of which may be elastic.

The term "surfaces" is used in this case to designate the elements between which the seal is intended to be positioned. For example, in the case of an HTE, these two surfaces will be a ceramic cell and a metal interconnector.

The method may also include, after the step of calculation of simulated pore plugging coefficient $F_{num}$, a step of calculation of a simulated mass leakage flow rate $Q_{mnum}$ of a fluid within a space sealed by the seal, such that:

$$Q_{mnum} = \frac{\pi \cdot M}{\mu \cdot R \cdot T \cdot F_{num}}(Pe^2 - Pi^2),$$

where

M: molar mass of the fluid, kg/mol $\mu$: dynamic viscosity of the fluid, Pa·s

R=8.314 J/K/mol

T: temperature of the fluid, K

Pi: pressure in the space which has been sealed, Pa

Pe: pressure outside the space which has been sealed, Pa.

The method may also include, when the values of coefficients $\lambda$, $\alpha$ and $\beta$ are unknown for the material of the seal, a determination of the values of coefficients $\lambda$, $\alpha$ and $\beta$ corresponding to the material of the seal obtained by performing the following steps:

- measurement of a mass flow rate $Q_m$ of a fluid enabling this fluid to be kept at a roughly constant pressure Pi in a space sealed by a second seal comprising said material during a deformation by creep of the second seal by compression of the second seal between two surfaces,
- calculation of an experimental pore plugging coefficient $F_{exp}$, representative of the tightness of the second seal at at least one interface between the second seal and one of the two surfaces, such that:

$$F_{exp} = \frac{\pi \cdot M}{\mu \cdot R \cdot T \cdot Q_m}(Pe^2 - Pi^2),$$

where

M: molar mass of the fluid, kg/mol $\mu$: dynamic viscosity of the fluid, Pa·s

R=8.314 J/K/mol

T: temperature of the fluid, K $Q_m$: mass flow rate of the fluid, kg/s

Pi: pressure in the space which has been sealed, Pa

Pe: pressure outside the space which has been sealed, Pa, and, after the calculation of the simulated pore plugging coefficient $F_{num}$, a step of calculation of the values of coefficients $\lambda$, $\alpha$ and $\beta$ made by minimising the difference between the values of $F_{num}$ and $F_{exp}$.

Thus, when coefficients $\lambda$, $\alpha$ and $\beta$ are unknown for the material of the seal, a leakage rate of a second seal made of a similar material, measured experimentally, is linked to local mechanical parameters (cumulative plastic deformation and axial stress) digitally calculated in order to be able to determine these coefficients. These coefficients may then be used to estimate a priori the tightness quality of a seal, whatever its shape, and its maintenance over time on the basis of a design and of digital simulations, without having to make experimental measurements.

The step of calculation of the values of coefficients $\lambda$, $\alpha$ and $\beta$ may be undertaken by minimising the difference between $F_{num}$ and $F_{exp}$, for example by applying the method of least squares.

The method may also include, prior to the implementation of the deformation by creep of the second seal, and when the second seal comprises at least one metal material, a step of thermal oxidisation of the second seal. Such a thermal oxidisation enables the creep properties of the second seal to be improved, and enables the disassembly of the second seal after deformation to be facilitated by forming a layer of alumina around the second seal.

The step of measurement of mass flow rate $Q_m$ may be obtained by performing:
  a first step of raising the temperature of the second seal and of the surfaces,
  a second step of bringing the surfaces into contact against the second seal and subjecting them to pressure,
  a third step of maintaining the pressure exerted by the surfaces against the second seal,
  a fourth step of reducing the pressure exerted by the surfaces against the second seal,
  a fifth step of separating at least one of the surfaces and the second seal.

The first step of raising the temperature may be implemented until a temperature of between approximately 600° C. and 1000° C. is reached, and/or the pressure exerted by the surfaces on the second seal during the third step may correspond to a force exerted by at least one of the surfaces on the second seal of between approximately 3 N/mm and 10 N/mm, and/or the third step of maintaining the pressure exerted by the surfaces on the second seal may be implemented for a period of between approximately 5 hours and 15 hours.

When the second seal is deformed by creep, a first face of the second seal may be positioned against one of the surfaces forming a support, where the pressure between a boss and the seal is applied by the other surface in contact with a second face, opposite the first face, of the seal, where at least one of the surfaces is able to move.

The step of digital simulation may be implemented through a finite element mechanical calculation application or software.

The method may also include, prior to the step of digital simulation, a step of measurement by laser profilometry of the profile of the seal and/or of the surfaces, where a digital mesh of the seal and/or of the surfaces, used in the course of the step of digital simulation, is produced from the measured profile of the seal and/or of the surfaces. It is thus possible to mesh the geometry as close as possible to reality by controlling the latter by laser profilometry.

Cumulative plastic deformation p and axial stress Smzz can be calculated during the digital simulation at Gauss points of elements of a digital mesh of the seal and of the surfaces, where the calculated values of cumulative plastic deformation p and of axial stress Smzz are averaged and reduced to nodes of the seal.

Contact length Lc may be obtained by calculating, by polynomial extrapolation of axial stress Smzz expressed in terms of a position at said interface between the seal and said one of the two surfaces, the values of the two abscissae corresponding to the maximum value divided by 10 of maximum axial stress Smzz, where contact length Lc is equal to the difference between said values of the two abscissae.

The cumulative plastic deformation and the axial stress may be calculated along the contact between the seal and at least one of the two surfaces.

The invention also relates to a device for estimating the tightness of a seal, including means able to implement a method for estimating the tightness of a seal as previously defined.

A device for estimating the tightness of a seal is also proposed, including at least:
  means for digital simulation of a deformation by creep of the seal by compression of the seal between two surfaces,
  means for calculation, at at least one interface between the seal and one of the two surfaces, of a cumulative plastic deformation p of the seal, of an axial stress Smzz between the seal and said one of the two surfaces, and of a contact length Lc between the seal and said one of the two surfaces, during the digital simulation,
  means for calculation of a simulated pore plugging coefficient $F_{num}$, representative of the tightness of the seal at said interface between the seal and said one of the two surfaces, such that:

$$F_{num} = \int_{ri}^{re} \int_{p} \lambda \cdot \left(\frac{Smzz}{\sigma_{seuil}}\right)^{\alpha} \cdot \left(\frac{p}{p_0}\right)^{\beta} dp \frac{dr}{r},$$

where
  $\lambda$, $\alpha$ and $\beta$: coefficients the values of which depend on the seal material $Lc = re - ri, m$ Smzz: axial stress, MPa
  $\sigma_{seuil}$: threshold stress equal to 1 MPa
  p: cumulative plastic deformation
  $p_0$: constant equal to 1.

The device may also include means for calculating a simulated mass leakage flow rate $Q_{num}$ of a fluid within a space sealed by the seal, such that:

$$Q_{mnum} = \frac{\pi \cdot M}{\mu \cdot R \cdot T \cdot F_{num}}(Pe^2 - Pi^2),$$

where
  M: molar mass of the fluid, kg/mol
  $\mu$: dynamic viscosity of the fluid, Pa·s $R = 8.314$ J/K/mol T: temperature of the fluid, K
  Pi: pressure in the space which has been sealed, Pa
  Pe: pressure outside the space which has been sealed, Pa.

The device may also include, when the values of coefficients $\lambda$, $\alpha$ and $\beta$ are unknown for the material of the seal, means for determining the values of coefficients $\lambda$, $\alpha$ and $\beta$ of the material of the seal including:
  means of deformation by creep by compression of a second seal between two surfaces,
  means for measuring a mass flow rate $Q_m$ of a fluid enabling this fluid to be kept at a roughly constant pressure Pi in a space sealed by a second seal comprising said material during a deformation by creep of the second seal by compression of the second seal between two surfaces,
  means for calculating an experimental pore plugging coefficient $F_{exp}$, representative of the tightness of the second seal at at least one interface between the second seal and one of the two surfaces, such that:

$$F_{exp} = \frac{\pi \cdot M}{\mu \cdot R \cdot T \cdot Q_m}(Pe^2 - Pi^2),$$

where
  M: molar mass of the fluid, kg/mol
  $\mu$: dynamic viscosity of the fluid, Pa·s $R = 8.314$ J/K/mol T: temperature of the fluid, K
  $Q_m$: mass flow rate of the fluid, kg/s Pi: pressure in the space which has been sealed, Pa
Pe: pressure outside the space which has been sealed, Pa,
means for calculating the values of coefficients λ, α and β able to minimise the difference between the values of coefficients $F_{num}$, and $F_{exp}$.

The device may also include means of finite element digital simulation of the seal and of the surfaces, including for example a finite element mechanical calculation application.

The invention also relates to a computer program product memorising an executable code for the implementation of a method for estimating the tightness of a seal as described above.

BRIEF DESCRIPTION OF THE ILLUSTRATIONS

Figure 2:
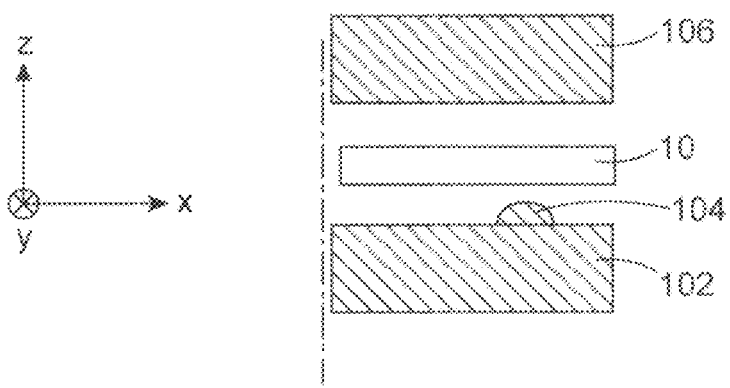
Figure 3:
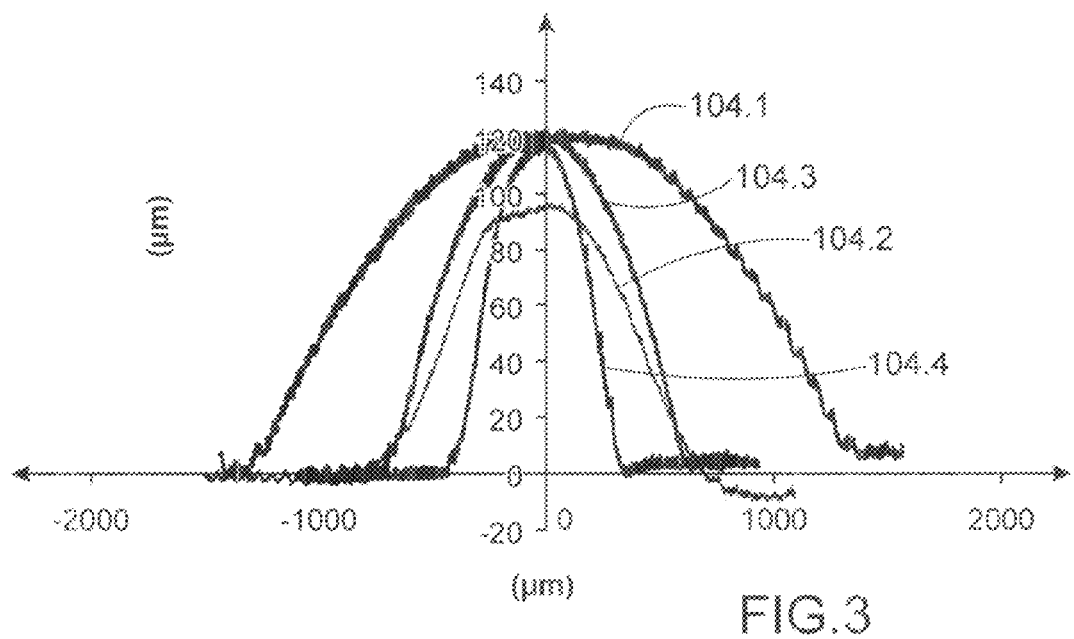
Figure 11:
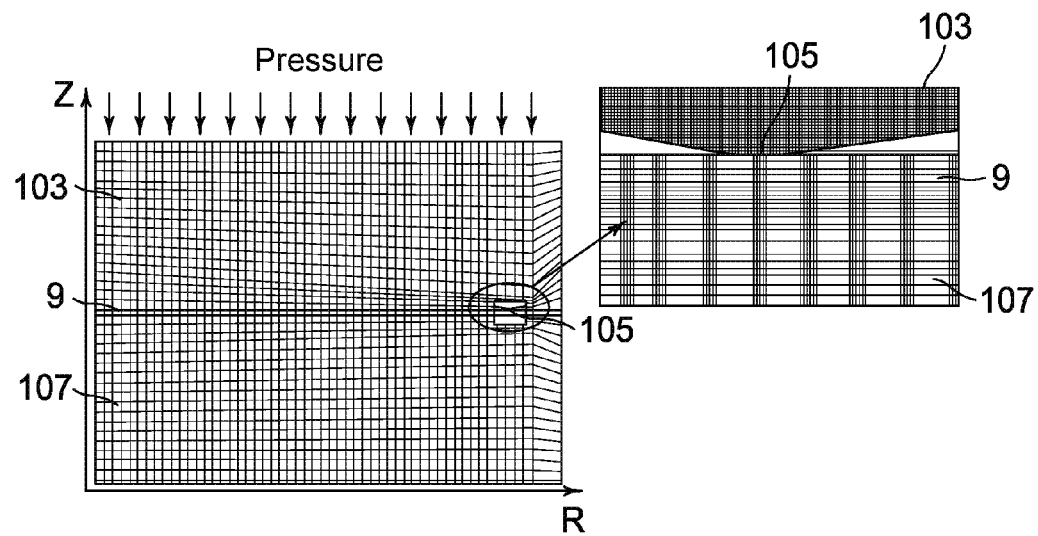
Figure 12:
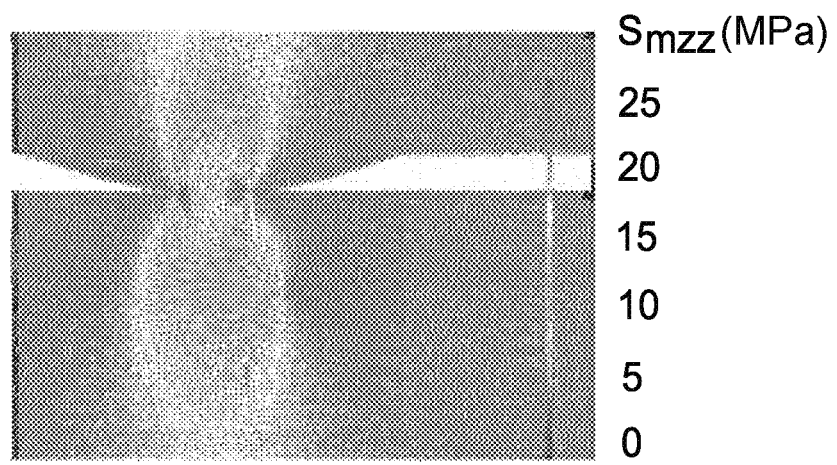
Figure 13:
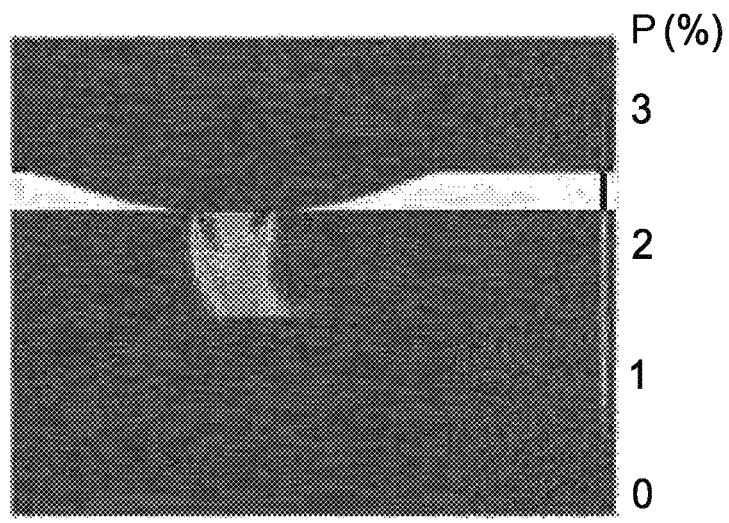
Figure 14:
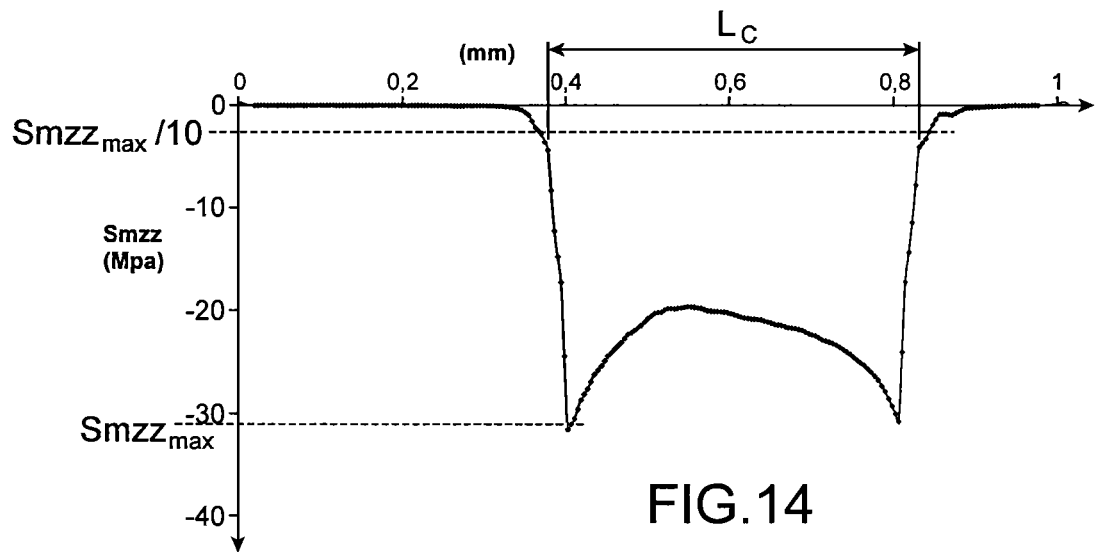
Figure 17:
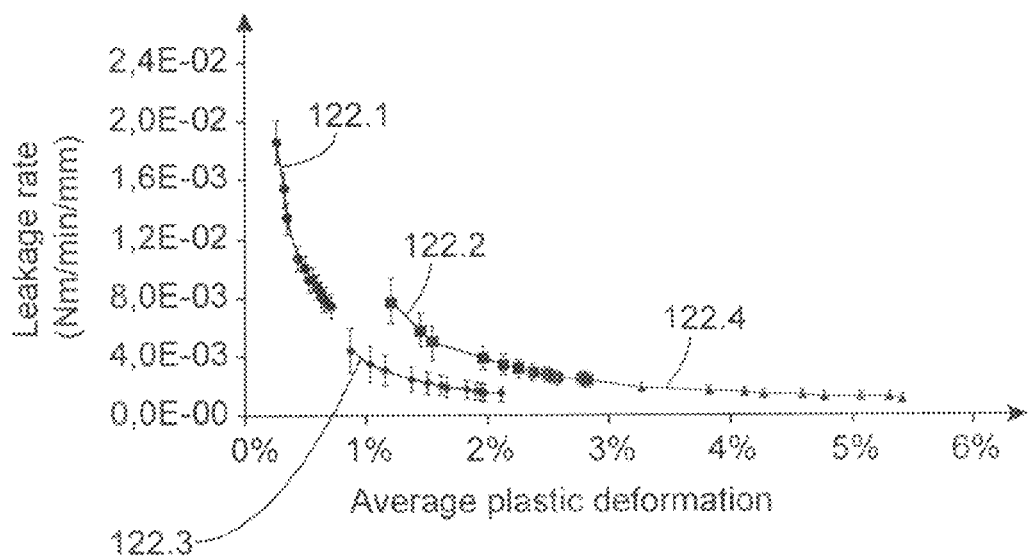
Figure 18:
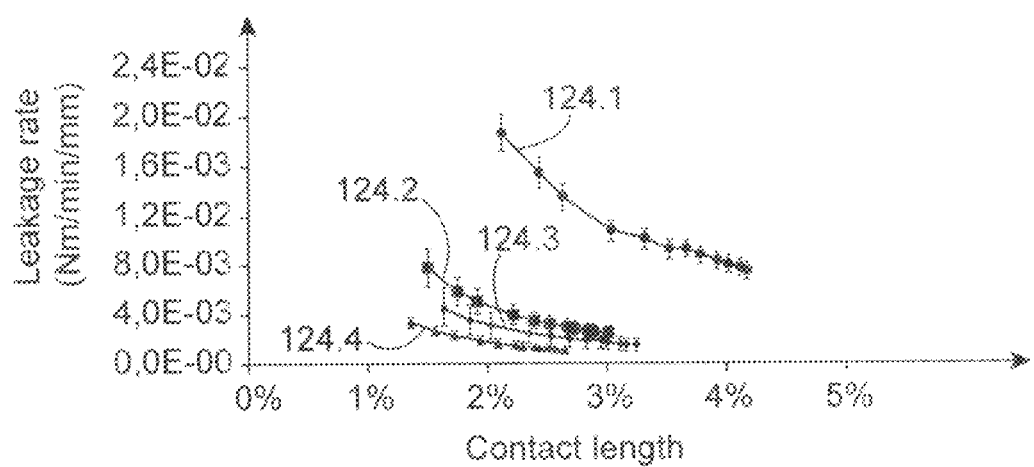
Figure 19:
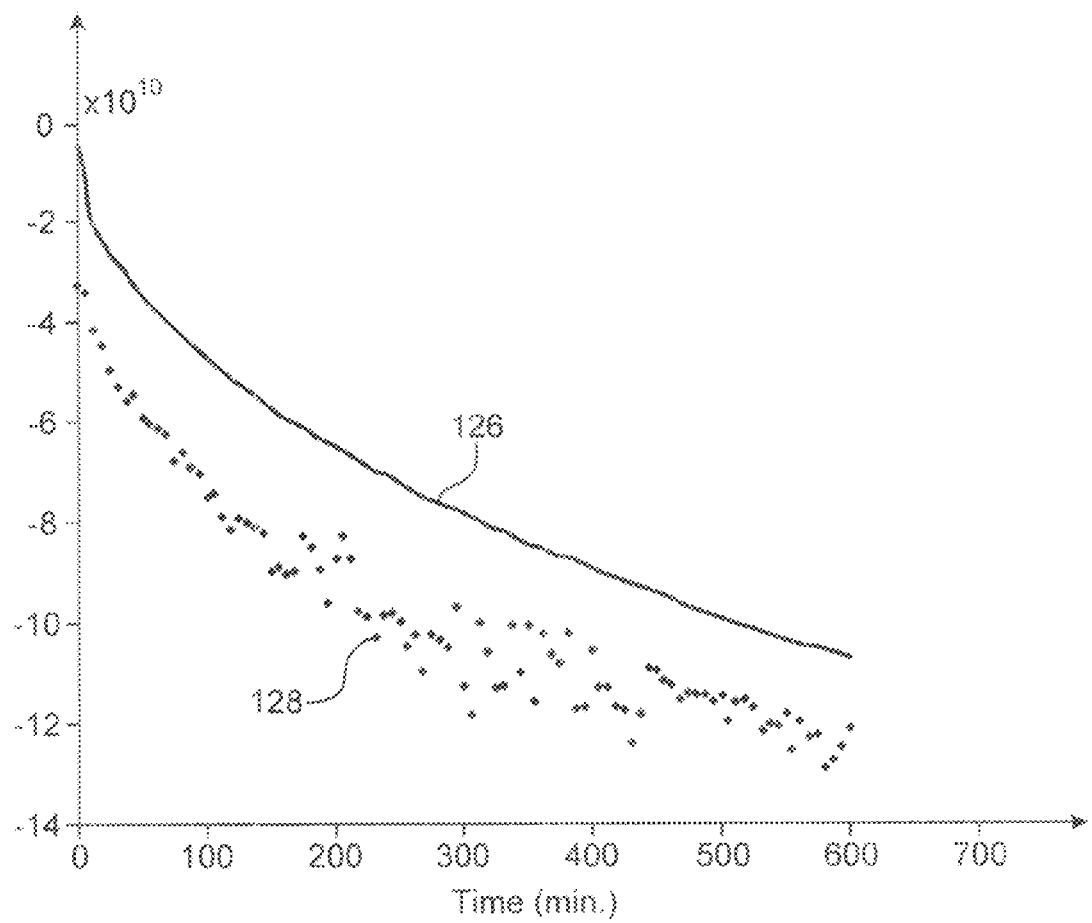
Figure 20:
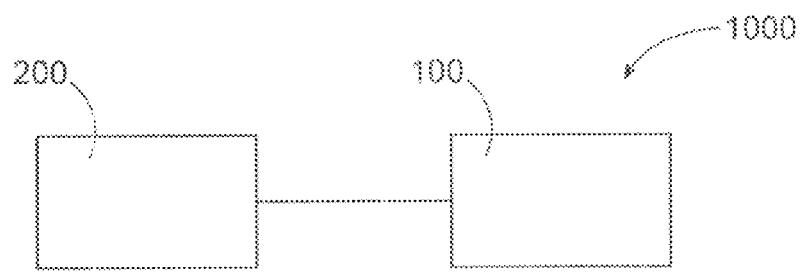

The present invention will be better understood on reading the description of example embodiments given purely as an indication and in no sense restrictively, making reference to the appended illustrations in which:

FIG. 1 represents a device for measuring a leak from a space sealed by a seal, which may be used in the course of a method for estimating the tightness of a seal, which is an object of the present invention, according to a particular embodiment, FIG. 2 is a section view of a seal positioned between two surfaces of a leakage measuring device which may be used in the course of a method for estimating the tightness of a seal, which is an object of the present invention, according to a particular embodiment, FIG. 3 represents the profiles of different bosses which may be used during a method for estimating the tightness of a seal, which is an object of the present invention, according to a particular embodiment, FIGS. 4 to 10 represent leakage rates measured in the course of a deformation by creep of a seal by the different bosses shown in FIG. 3, and for different forces applied to the seal during the deformation, FIG. 11 represents a digital mesh of a seal and of two surfaces produced in the course of a method for estimating the tightness of a seal, which is an object of the present invention, according to a particular embodiment, FIGS. 12 and 13 represent the distribution of the axial stress and of the cumulative plastic deformation calculated during the digital simulation accomplished in the course of a method for estimating the tightness of a seal, which is an object of the present invention, according to a particular embodiment, FIG. 14 represents the axial stress calculated in the course of the digital simulation of a method for estimating the tightness of a seal, which is an object of the present invention, according to a particular embodiment, FIGS. 15 to 18 represent leakage rates measured in the course of a deformation by creep of a seal by the different bosses represented in FIG. 3, and for different forces applied to the seal during the deformation, as a function of the calculated average cumulative plastic deformation and contact length, FIG. 19 represents values of $F_{num}$ and $F_{exp}$ obtained during implementation of a method for estimating the tightness of a seal, which is an object of the present invention, FIG. 20 represents a device for estimating the tightness of a seal, which is also an object of the present invention, including means able to implement a method for estimating the tightness of a seal, which is an object of the present invention, according to a particular embodiment.

Identical, similar or equivalent parts of the various figures described below have the same numerical references, to make it easier to move from one figure to another.

The various portions represented in the figures are not necessarily represented at a uniform scale, in order to make the figures more readable.

The various possibilities (variants and embodiments) must be understood as not being mutually exclusive, and being able to be combined with one another.

DETAILED DESCRIPTION OF PARTICULAR EMBODIMENTS

The leaks which it is sought to reduce within a HTE electrolyser, which correspond to a flow of gas from the interior of the sealed space of the seal to the exterior of this space, are flows of a fluid through pores. These pores, which are present at the interface between the seal and the electrochemical cell and/or between the seal and the metal interconnector of the HTE electrolyser, are formed by the asperities present at the interface of these elements.

The Reynolds number Re is an adimensional number characterising a flow of a fluid, in particular the nature of its state (laminar, transient or turbulent), and representing the ratio between the forces of inertia and the viscous forces of this flow. This Reynolds number Re is defined by the following equation:

$$Re = \frac{\rho S L}{\mu} = \frac{SL}{v} \quad (1)$$

where
ρ: density of the fluid, kg/m³
S: speed of the fluid, m/s
L: characteristic length, m
M: dynamic viscosity of the fluid, Pa·s $$v = \frac{\mu}{\rho}:$$

kinematic viscosity of the fluid, m²/s

Under the conditions encountered in the electrolyser, i.e. when the fluid in question is air, when the temperature is equal to approximately 800° C. and when the pressure is equal to approximately 1.2 bar, and taking a fluid speed of 1 m/s and contact length of $1.10^{-4}$ m, the Reynolds number Re is equal to 0.763, corresponding to a flow of the laminar type.

In this type of flow, under stationary conditions (where the variables are independent of time), the flow of a fluid through a porous medium is described by Darcy's law.

In the case of a radial flow, Darcy's law for a gas is:

$$Q_m = \frac{A \rho k}{\mu} \frac{dP}{dr} \quad (2)$$

where
$Q_m$: mass flow rate, kg/s
A: area of the flow area, m²
ρ: density, kg/m³
k: intrinsic permeability of the porous medium, m²
μ: dynamic viscosity, Pa·s $$\frac{dP}{dr}:$$

radial pressure gradient, Pa/m.

When the fluid is compressible, which is the case with air, the law of perfect gases applies:

$$PV = nRT = \frac{mRT}{M} \quad (3)$$

where
P: pressure, Pa
V: volume of the fluid, m³
N: quantity of material, mol
R: constant of perfect gases (R=8.314 J/K/mol)
T: temperature of the fluid, K
m: mass of the fluid, kg
M: molar mass, kg/mol.

We therefore have:

$$\rho = \frac{MP}{RT} \quad (4)$$

From above equations (2) and (4) the following equation may be written:

$$\frac{Q_m RT \rho}{MP} = \frac{A \rho k}{\mu} \frac{dP}{dr} \quad (5)$$

And area A may be written:

$$A = 2\pi r h \quad (6)$$

Where:
r: radius of the pore, m
h: characteristic height, m.

From above equations (5) and (6) the following may be written:

$$Q_m \frac{dr}{r} = \frac{2\pi M}{\mu RT} h k P dP \quad (7)$$

Term $$\frac{2\pi M}{\mu RT} = \delta$$

is independent of pressure. The term hk depends on r since it varies according to the contact length, and will be noted κ(r) in what follows.

To determine the mass leakage flow rate between the interior and the exterior of the space sealed by the seal at an interface with the seal, equation (7) is integrated by taking into account the limiting conditions of these two media:

$$Q_m \int_{r_i}^{r_e} \frac{dr}{\kappa(r)r} = \delta \int_{P_i}^{P_e} P dP \quad (8)$$

Or again:

$$Q_m \int_{r_i}^{r_e} \frac{dr}{\kappa(r)r} = \frac{\delta}{2}(P_e^2 - P_i^2) \quad (9)$$

where
$r_e$ and $r_i$: external and internal radii of the deformation of the seal, m (and where $r_e - r_i$=contact length).
$P_e$ and $P_i$: internal and external pressures of the space sealed by the seal, Pa.

The analytical radial leakage flow rate according to Darcy's law is then expressed in terms of a difference of the squares of the pressures between two media, of geometrical parameters of the device in question, and of parameters relating to the fluid under examination.

Previous equation (9) may also be written in the following form:

$$\int_{r_i}^{r_e} \frac{dr}{\kappa(r)r} = \frac{\delta}{2Q_m}(P_e^2 - P_i^2) \quad (10)$$

The more permeable the medium the more the fluid is able to flow easily, and the greater the leak. Similarly, the greater the height of the pores (or holes), the greater will be the leak.

In equation (10) above, the term κ(r) contains the terms of permeability and of pore height favouring the leak. Consequently, when term $$\frac{1}{\kappa(r)}$$

increases it means that the leak is reduced and that the pores facilitating the passage of the fluid are gradually plugged. Equation (10) is then a pore plugging coefficient at the interface of the seal and will be noted $F_{exp}$ such that:

$$F_{exp} = \int_{r_i}^{r_e} \frac{dr}{\kappa(r)r} = \frac{\delta}{2Q_m}(P_e^2 - P_i^2) \quad (11)$$

A method is now described for estimating the tightness of a seal intended to be used for example in an electrolyser of the HTE type, between an electrochemical cell and a metal interconnector of this electrolyser.

To be able to determine a simulated pore plugging coefficient $F_{num}$ representative of the tightness of the seal which it is sought to estimate, coefficients λ, α and β inherent to the material of the seal must be known. In the example described here these coefficients are unknown. To determine these coefficients, prior to the calculation of simulated pore plugging coefficient $F_{num}$, an experimental measurement is made of the leakage rate of a second seal 10, composed of the same material as that of the seal the tightness of which it is sought to characterise, where this leakage rate is equal to mass flow rate $Q_m$ of a fluid escaping from the interior of a volume sealed by the second seal towards the exterior of this volume, through the pores formed by the asperities at the interfaces of second seal 10.

From this measured leakage rate an experimental pore plugging coefficient $F_{exp}$ may be calculated. This experimental pore plugging coefficient $F_{exp}$ will then be used to determine coefficients λ, α and β inherent to the material of the seal which will then be able to be used to estimate, a priori, i.e. by calculation, without having to make experimental leakage rate measurements, the tightness of any seal composed of the same material as that of second seal 10, from a calculation of simulated pore plugging coefficient $F_{num}$.

The seal the tightness of which it is sought to estimate by calculation may be of any shape. It may notably have protruding portions, or bosses, contributing to the accomplishment of the tightness, notably when the portions between which the seal is intended to accomplish the tightness (where these portions are, for example, an electrochemical cell and a metal interconnector of a HTE electrolyser) have surfaces, intended to be in contact with the seal, which are relatively flat. Second seal 10 used during the experimental measurement's phase of the method may or may not therefore be of a shape similar to that of the seal the tightness of which it is sought to characterise.

The measurements are made by a measuring device 100, represented in FIG. 1, enabling a leak to be measured from the space sealed by second seal 10 as a function of a force per unit length applied to second seal 10 and of its compression.

Measuring device 100 contains a lower surface 102 used as a support on which second seal 10 is intended to rest. This lower surface 102 may include a boss 104 intended to deform second seal 10 by creep when this seal is pressed against this boss 104. Device 100 also includes an upper surface 106 intended to press second seal 10 against boss 104 in order that the latter deforms second seal 10 by creep.

FIG. 2 represents a section view of second seal 10 positioned between the two surfaces 102 and 106, and also the profile of boss 104. Seen from above, i.e. in plane (X,Y) along axes X, Y and Z represented in FIG. 2, boss 104 is roughly circular in shape, and the space sealed by second seal 10 corresponds to the space within the circle delimited by boss 104, between second seal 10 and lower surface 102.

In this case measuring device 100 is associated with an air furnace enabling the measurements to be made up to a temperature equal to approximately 1000° C.

The measured leakage rate is equal to the flow rate of gas, for example air, required to maintain a high pressure, which is roughly constant and equal for example to approximately 200 mbar, in the area sealed by second seal 10. The fluid exits through an aperture 105 formed through lower surface 102 in the space intended to be sealed. Device 100 includes means for regulating the flow rate of the fluid enabling this high pressure to be maintained roughly constant. The leak occurs through the pores formed by the asperities of second seal 10 and those of boss 104, which asperities form a porous medium the configuration of which varies over time, where second seal 10 fills some of these asperities when it is subject to creep.

Device 100 enables the pressure within the sealed space, the compression of the seal and the force applied to the seal during the test to be controlled.

Second seal 10 is, for example, a strip consisting of Fecralloy (an alloy consisting of iron, chromium and aluminium). The seal the tightness of which it is sought to estimate by calculation also consists of Fecralloy. In one variant, the seal the tightness of which it is sought to estimate by calculation, and second seal 10, could be made of silver.

Surfaces 102 and 106 contain, for example, a nickel-based alloy, for example of the Udimet 720 type. In the HTE the seal is for example intended to be positioned between elements made of steel of the Crofer type or Udimet type, of an alloy of the Haynes 230 type, or again of zirconium.

To illustrate the calculations then made during the method, the measurements will be made by deforming several seals by creep from different bosses, and with different forces applied to the seals.

FIG. 3 represents the profiles of different bosses 104.1, 104.2, 104.3 and 104.4 used to accomplish a deformation by creep of several second seals 10. In this case these profiles are measured precisely by laser profilometry.

Second seals 10 are firstly pre-oxidised in the course of a heat treatment lasting approximately 30 h at approximately 900° C. in order to improve their creep endurance and to facilitate disassembly after the deformation by forming a layer of alumina around the seal.

The experimental procedure of deformation by creep of the seals in measuring device 100 is then implemented. To this end, one of second seals 10 is placed in the chamber of the furnace of device 100, between surfaces 102 and 106, and the temperature is then raised to approximately 800° C. at a rate of approximately 5° C./min.

When this temperature has been reached upper surface 106 is brought into contact with second seal 10 and air is then conveyed into the gas circuit. The clamping sequence intended to deform the second seal by creep is then started. The force, corresponding to the force exerted by upper surface 106 on second seal 10, is increased to a target value, over approximately 50 seconds.

This force is then maintained for approximately 10 h, and then brought back down to zero over approximately 50 seconds. Several tests were made with different bosses 104.1 to 104.4, with forces equal to 3, 5 and 10 N/mm. The leak, the compression of the seal and the force are monitored and measured throughout the different phases of the deformation.

The values of the forces applied to the second seal depend on the envisaged application and on the leakage ranges under examination. Thus, in the case of seals intended to accomplish a tightness within an HTE electrolyser subject to a low load, forces ranging from 3 to 10 N/mm are effective in order to obtain a leakage rate corresponding to approximately 1% of the hydrogen produced, i.e. approximately $10^{-3}$ Nml/min./mm. The percentage of error in relation to the measured leakage rate is less than approximately 10%.

Figure 4:
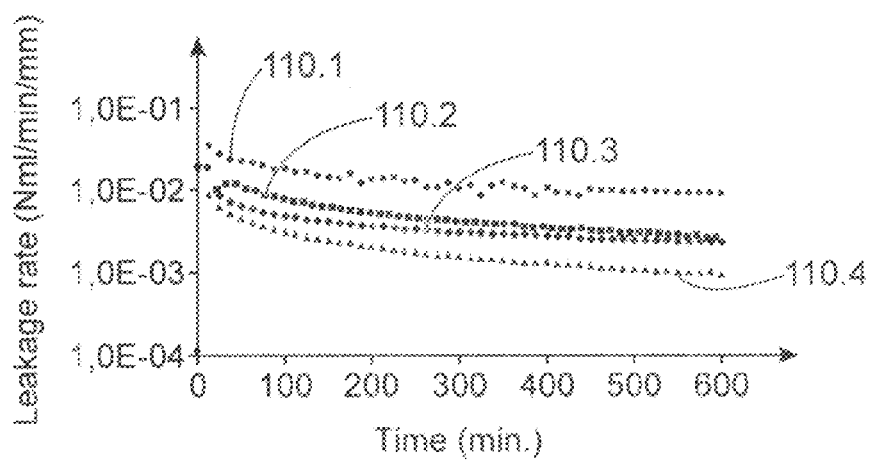

Curves 110.1 to 110.4 represented in FIG. 4 correspond to the leakage rates measured during the different phases of the deformation of second seal 10 by the different bosses 104.1 to 104.4, for a force equal to approximately 3 N/mm. Similarly, curves 112.1 to 112.4 and 114.1 to 114.4 represented in FIGS. 5 and 6 correspond to the leakage rates measured during the different phases of deformation of seal 10 by the different bosses 104.1 to 104.4, for a force respectively equal to approximately 5 N/mm and 10 N/mm.

These curves indicate that the sharper the boss the lower is the leakage rate. Indeed, the finer the boss, the more the applied force is localised, and the more the seal will then be deformed. As it is deformed the seal fills the asperities present at the interface between the seal and the boss, thus lengthening the leakage path of the gas which then has greater difficulty escaping.

These measurements of the leakage rate are also shown in FIGS. 7 to 10, and this time the curves are grouped according to the boss used.

Figure 5:
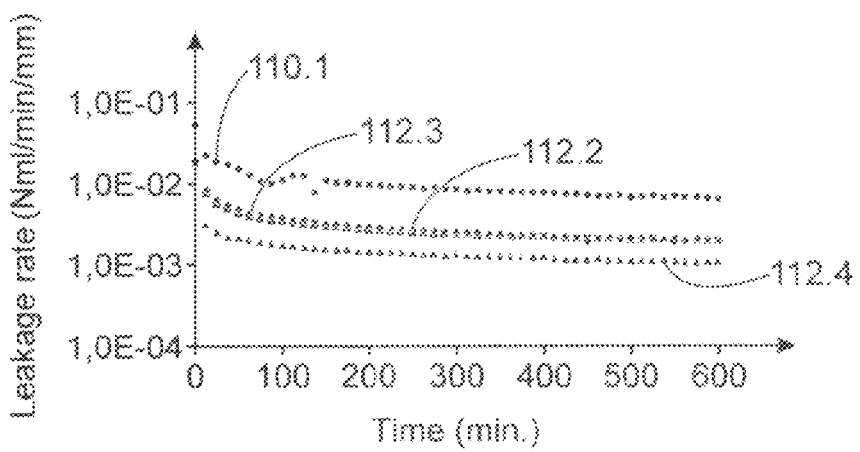
Figure 6:
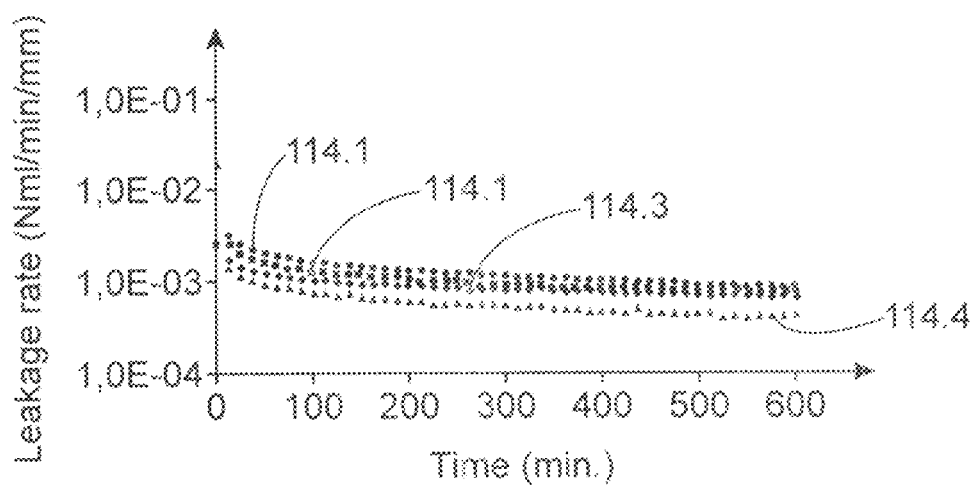
Figure 7:
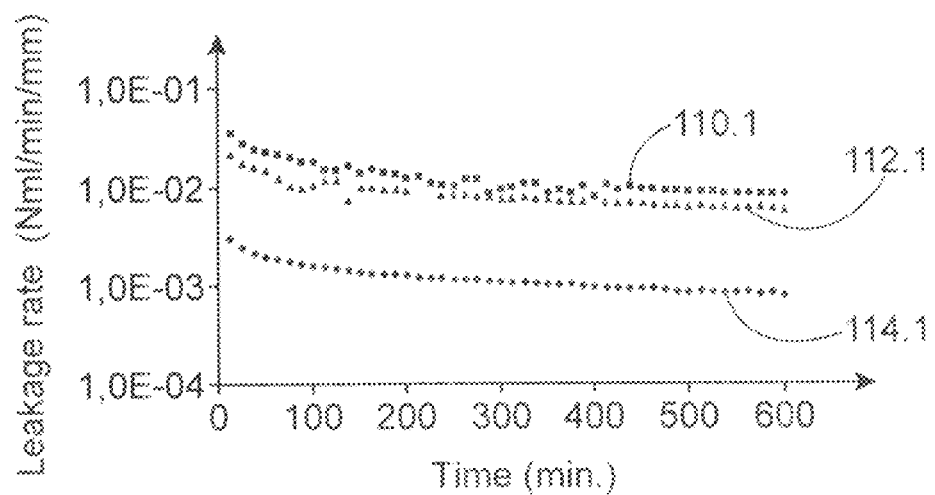
Figure 8:
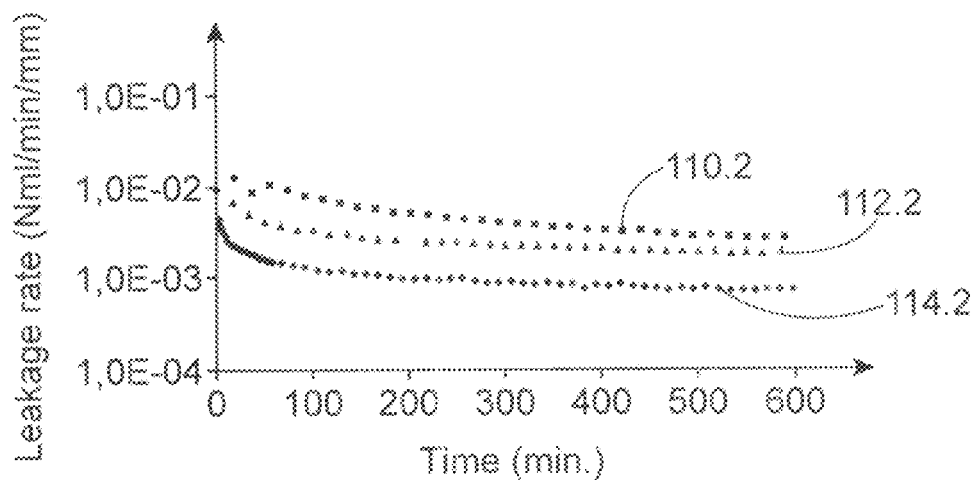
Figure 9:
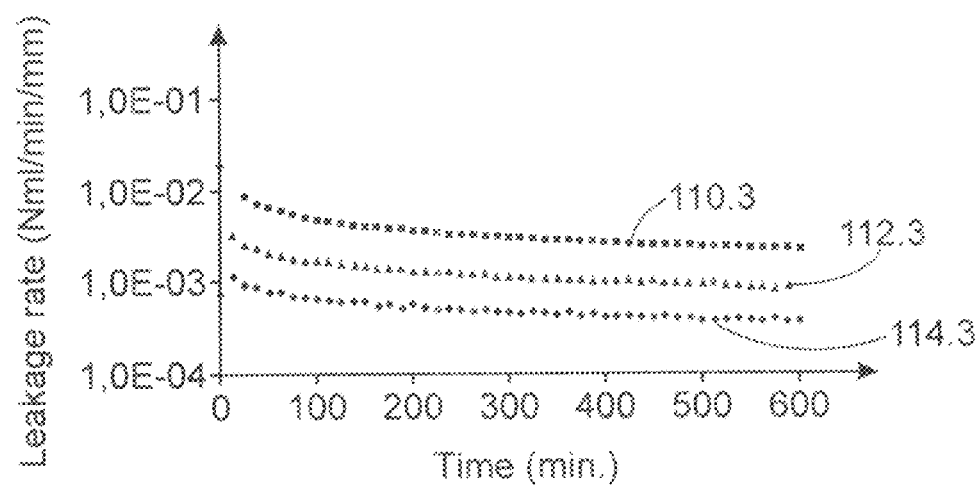
Figure 10:
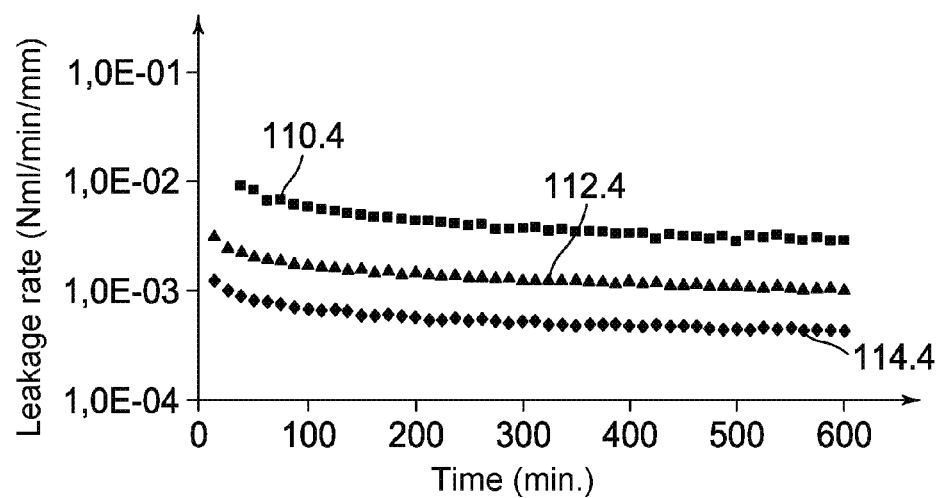

This, in FIG. 7, curves 110.1, 112.1 and 114.1, previously represented in FIGS. 4 to 6, are grouped into a single graph, to compare the influence of the force for a given boss.

From these FIGS. 7 to 10 it can be seen that whatever boss is used the leakage rate is reduced when the force is increased. Thus, the greater the force transmitted to the seal the more it will creep and the less easily the gas will escape.

It is possible to check that the force has indeed been distributed along the entire seal by measuring by laser profilometry at different areas the profile of second seal 10 having been subject to the deformation. This experimental deformation may also be compared with the one calculated at a later stage.

This phase of experimental measurement of the leakage rate is implemented only if it is desired to determine coefficients λ, α and β inherent to the material of the seal the tightness of which it is sought to estimate. If these coefficients are known it is not necessary to make these measurements, since the tightness can be estimated by calculation, without measurements, as described below.

The phase of simulation and of calculation allowing, when coefficients λ, α and β inherent to the material of the seal are unknown, these coefficients to be determined notably by using the measurement of previously determined experimental pore plugging coefficient $F_{exp}$ is now described.

A digital mesh is first produced representing a seal 9 the tightness of which it is sought to evaluate, and elements 103 and 107 between which seal 9 is intended to be positioned. Elements 103 and 107 are, for example, an electrochemical cell and a metal interconnector of a HTE electrolyser between which seal 9 is intended to provide tightness. By analogy with the previously made measurement, elements 103 and 107 will be called "surfaces" in what follows. The digital mesh of seal 9 and of surfaces 103, 107 is represented in FIG. 11. To facilitate understanding of the invention, the geometry (profile) of seal 9 is in this case similar to that of second seal 10. The geometries (profiles) of surfaces 103 and 107 are also comparable to those of surfaces 102 and 104, except that in the example described here it is supposed that it is upper surface 103 which includes a boss 105 (of profile similar to that of boss 104) intended to compress seal 9.

A deformation by creep of joint 9 is simulated, and subsequently the local mechanical fields of the seal, accessible by this digital simulation of the deformation by creep, are determined. Indeed, by analogy with the damage laws in which the stresses and the deformation by accumulation of damage reveal holes, or pores, in the material leading to its fracture, the leakage rate which it is sought to estimate here is related to the appearance or plugging of holes in the porous medium, i.e. at the interfaces between seal 9 and surfaces 103 and 107. It is therefore sought to express this leakage rate according to the relevant mechanical parameters which contribute to the plugging of the pores in order to estimate theoretically and a priori the leakage flow rate of a given seal according to some parameters to be determined digitally.

The digital simulation of the deformation by creep of sealing joint 9 is produced by a computer, in this case through a finite element mechanical calculation application, capable of calculating the local mechanical fields during a deformation by creep, for example the Cast3M application.

The mechanical fields taken into consideration in this case are axial stress, noted Smzz and equal to the stress along axis Z represented in FIG. 2, and the cumulative plastic deformation, noted p. The calculation is made for example in axisymmetrical 2D. The different elements are modelled using, for example, elements of the quadrangle type with quadratic interpolation and reduced integration (8 nodes and 4 Gauss points for each quadrangle). In the present case, the modelling of seal 9, surfaces 103, 107 and boss 105 is accomplished with 12800 elements and 38000 nodes in the model. Surfaces 103, 107 are modelled by giving them the properties of Udimet 720, i.e. elastic properties at 800° C. Fecralloy seal 9 has elasto-viscoplastic properties at 800° C. according to a power law such that:

$$\dot{\varepsilon} = de_0 \left( \sinh\left( \frac{\sigma - \sigma_{seuil}}{\sigma_0} \right) \right)^b \quad (12)$$

where
$\varepsilon$: deformation speed
$de_0$: constant equal to 0.51 s$^{-1}$
$\sigma$: stress, MPa
$\sigma_{seuil}$: threshold stress equal to 1 MPa
$\sigma_0$: constant equal to 221.75 MPa
b: constant equal to 4.58

The modelling of seal 9 is therefore accomplished by giving it such properties.

The modelling of boss 105 may be accomplished from the real profile of the boss measured by laser profilometry, which is then smoothed by a polynomial the coefficients of which are entered as parameters in the data file of the Cast3M application. The profile of the modelled boss may therefore be modified by modifying only these coefficients, the mesh then being generated automatically by the application. In the example described here, modelled boss 105 has a profile matching profile 104.3 represented in FIG. 3.

In the simulation the contact is managed either side of the seal, i.e. simultaneously on the side of the lower surface and on the side of the upper surface, and a friction coefficient equal to 0.2 is applied.

The modelling of the different elements 9, 103, 105 and 107 accomplished here is represented in FIG. 11. The model is blocked in direction R (the direction parallel to the main plane of seal 9) and lower surface 102 is blocked in direction Z, i.e. considered as stationary in the direction perpendicular to the main plane of seal 9. The pressure is applied uniformly to the top of upper surface 103. The simulation is accomplished bearing in mind that seal 9 is pressed between surfaces 103 and 107 for a long period, for example several years.

During the simulation the mechanical fields are examined after the load is applied, after 20 min., after 40 min., and then every hour until the end of loading.

FIGS. 12 and 13 represent the distribution of the axial stress (Smzz) and of the cumulative plastic deformation (p) in the modelled elements, calculated after pressure has been maintained for 10 hours.

The leak occurring between seal 9 and surface 103 including boss 105, and the mechanical fields (axial stress and cumulative plastic deformation) occurring when these two portions make contact are the most relevant since they are most likely to have an influence on the measured level of tightness. At an instant t these magnitudes are calculated at the Gauss points of the modelled elements. For each time increment the value of these parameters in the element is averaged. These values are then reduced to the nodes for post-processing.

As a variant, when the leak occurs between seal 9 and the two surfaces 103 and 107, the local mechanical fields are considered at the two interfaces between the seal and these surfaces. If the geometry of these elements is symmetrical (for example when the surfaces no longer have a boss and when the profile of the seal is the same in both these interfaces), it will be possible to consider that the leak will be similar at these two interfaces, and to calculate the mechanical fields only at a single interface.

One of the important parameters having an influence on the leakage flow rate is the contact length between boss 105 and seal 9. This length is determined using the axial stress calculated between seal 9 and boss 105: when the stress is zero this means that boss 105 and seal 9 do not touch, and the contrary if the axial stress is non-zero. FIG. 14 represents this axial stress graphically during the simulated deformation by creep of seal 9, at the interface between seal 9 and boss 105. It can be seen in this FIG. 14 that the axial stress has a profile with two distinct peaks, or maxima, 116.1 and 116.2. One analytic method to determine the contact length consists in selecting the maximum value of axial stress $Smzz_{max}$. This maximum axial stress $Smzz_{max}$ is then divided by 10. The value obtained is then extrapolated polynomially to find the two corresponding abscissae. Contact length Lc is then the difference between the two abscissae obtained. As a variant, it may also be considered that the contact length is equal to the distance over which the axial stress is non-zero.

The mechanical fields taken into consideration in this case to determine by calculation the leakage rate of seal 9 are axial stress Smzz and cumulative plastic deformation p.

Figure 15:
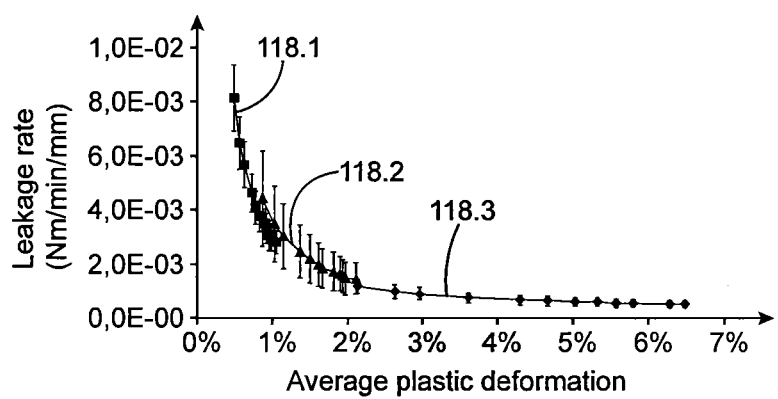
Figure 16:
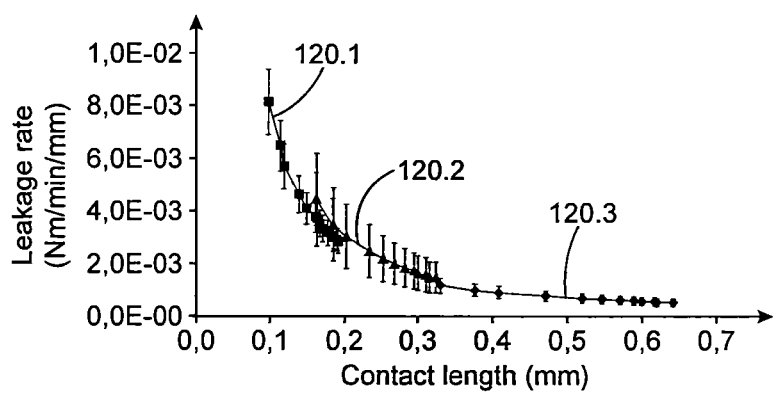

Indeed, curves 118.1 to 118.3 and 120.1 to 120.3 of FIGS. 15 and 16 represent the experimental leakage rate measured as a function, respectively, of the average cumulative plastic deformation along the joint-boss contact, and of contact length Lc, calculated in Cast3M for these same tests. Curves 118.1 to 118.3 and 120.1 to 120.3 relate to boss 104.3 for forces of 3, 5 and 10 N/mm. For each force level three tests were undertaken and the experimental dispersion was reported using error bars. Finally, for each force level the measurements and the calculations were made respectively after 20 min., 40 min. and 1 h, and then every hour until 10 h.

The different points of these curves are therefore equal to the values at these different time intervals.

When a single boss geometry is considered, it can therefore be seen, from these curves, that the leakage rate is directly related to the cumulative plastic deformation and to the contact length. It can be seen that the leakage rate reduces when the chosen relevant magnitudes, namely the cumulative plastic deformation and the contact length, increase, and a certain continuity is noted when passing from one loading level to the next. A single one of these magnitudes (cumulative plastic deformation or contact length) can enable the leakage rate to be estimated a priori, for a fixed-geometry boss.

Curves 122.1 to 122.4 and 124.1 to 124.4 of FIGS. 17 and 18 also represent the experimental leakage rate measured as a function, respectively, of the average cumulative plastic deformation along the joint-boss contact and of the contact length Lc calculated in Cast3M for these same tests, but considering the different bosses 104.1 to 104.4 and a force level of fixed value (in this case 5 N/mm). The error bars correspond to the experimental dispersion, and each point of these curves corresponds to a measurement made at a certain time interval.

Unlike the previous case (fixed geometry and variable force), when the load level (force) is fixed, but the type of geometry of the boss changes, the relationship linking the leakage rate with the parameters under examination (cumulative plastic deformation and contact length) is not direct, given that there is no function providing a continuity of the magnitudes when changing from one geometry to the next.

Other elements are considered to enrich this approach. The cumulative plastic deformation and the contact length are therefore correlated at different power levels in order to relate them to the measured leakage rate. Thus, by analogy with damage laws, in which the stresses and the deformation by accumulation of damage reveal holes in the material leading to its fracture, the leakage rate is related to the appearance or to the plugging of holes in the porous medium. The damage corresponding in this case to a plugging of holes will be expressed as a function of the identified parameters, namely cumulative plastic deformation p and axial stress Smzz. By considering the situation at an instant t, the experimental leakage rate and the history of the digital loading path are known.

Axial stress Smzz and cumulative plastic deformation p are calculated at the Gauss points of the elements. For each time increment the value of these parameters in the element is averaged, and these values are then reduced to the nodes for post-processing. A value is then obtained corresponding to the conditions required for hole-plugging locally, i.e. for each node along the contact between the surface and the seal. This pore plugging calculated for each node is written:

$$D_{noeud} = \int_p \lambda * \left(\frac{Smzz}{\sigma_{seuil}}\right)^\alpha * \left(\frac{p}{p_0}\right)^\beta dp \quad (13)$$

The integration interval of p is between 0 and the maximum value attained by p during the simulation, called pmax.

According to equation (11) derived from Darcy's law, pore plugging is related to the permeability of the medium and also to a passage height. These characteristics can be related to calculated pore plugging $D_{noeud}$. Thus, when $D_{noeud}$ increases, this means that the pore is filled, and that the fluid will find it less easy to escape through the pore. This term then corresponds to $$\frac{1}{\kappa(r)},$$

a term which must then be integrated along the contact (where variable r corresponds to the position along this contact) at instant t, considered to take account of all the plugged or created asperities occurring in the leak path.

We therefore have:

$$F_{num} = \int_{r_i}^{r_e} \frac{dr}{k(r)r} = \int_{r_i}^{r_e} \frac{D_{noeud} * dr}{r} \quad (14)$$

When coefficients $\lambda$, $\alpha$ and $\beta$ inherent to the material of seal 9 are unknown, they are then determined by minimising the difference between $F_{exp}$ and $F_{num}$. This minimisation is accomplished, for example, by applying the method of least squares: approximate values of coefficients $\lambda$, $\alpha$ and $\beta$ are first chosen in order to bring closer the values of $F_{exp}$ and $F_{num}$. By an iterative optimisation method, it is then sought to reduce the difference of values between $F_{exp}$ and $F_{num}$ until the desired minimisation is reached. A tolerance equal to approximately 1% may for example be accepted for this difference of values between $F_{exp}$ and $F_{num}$.

For example, for a fecralloy seal, the following values apply: λ=1.86E15, α=5.58E-2 and β=−5.99E-2.

Coefficients λ, α and β reflect the influence of the two parameters in question (cumulative plastic deformation along the contact and axial stress), and the predominant role observed experimentally of the cumulative plastic deformation on the leakage rate. Thus, if during a test the applied force is reduced, and consequently the axial stress is reduced, the leakage rate for its part does not increase.

Starting with simulated pore plugging coefficient $F_{num}$, it is therefore possible to evaluate the tightness of seal 9, and repeat simulations by modifying some geometrical parameters of the seal in order to optimise this tightness.

If the values of coefficients λ, α and β are known for a given material it is therefore possible to estimate the tightness of any type of seal containing this material by accomplishing the previously described simulation.

Curve 126 represented in FIG. 19 corresponds to the values of $F_{num}$ obtained during the previously described method for estimating the tightness of a fecralloy seal and accomplished with boss 104.1 with a force equal to 3 N/mm. By comparison, points 128 represented in FIG. 19 correspond to the values of $F_{exp}$ calculated for a given deformation of the seal.

FIG. 20 represents a device 1000 for estimating the tightness of a seal. Device 1000 includes previously described measuring device 100, together with computer means 200 able to implement notably the digital simulation of the deformation by creep of the seal and the different calculations made during the method for estimating the tightness of seal 9. Computer means 200 include, for example, one or more computers on which software means, such as the finite element mechanical calculation application, which is notably capable of calculating the local mechanical fields during the simulation of the deformation by creep of the seal, for example the Cast3M application, are installed. Computer means 200 may also include calculation means to calculate, for example, experimental pore plugging coefficient $F_{exp}$ from measurements made by measuring device 100, or to calculate coefficients λ, α and β by minimising the difference between the values of coefficients $F_{num}$ and $F_{exp}$. To this end, the computer means may be coupled to measuring device 100, as represented in FIG. 20, in order that data exchanges may be made between computer means 200 and the measuring means and/or means for controlling measuring device 100. Measuring device 100 may notably be controlled, during measurements of a leak of seal 9, by means 200.

The invention claimed is:

1. A method for estimating tightness of a seal, comprising:
performing, on a computer, digital simulation of a deformation by creep of the seal by compression of the seal between two surfaces;
calculating, on the computer and at at least one interface between the seal and one of the two surfaces, of a cumulative plastic deformation p of the seal, of an axial stress Smzz between the seal and the one of the two surfaces, and of a contact length Lc between the seal and the one of the two surfaces, during the digital simulation;
calculating, on the computer, a simulated pore plugging coefficient $F_{num}$, representative of tightness of the seal at the interface between the seal and the one of the two surfaces, such that:

$$F_{num} = \int_{ri}^{re} \int_{0}^{pmax} \lambda \cdot \left(\frac{Smzz}{\sigma_{seuil}}\right)^{\alpha} \cdot \left(\frac{p}{p_0}\right)^{\beta} dp \frac{dr}{r},$$

where
λ, α and β: coefficients with values that depend on the material of the seal,
re and ri: respectively external radius and internal radius of the deformation of the seal, m,
r: position along contact between the seal and the at least one of the two surfaces, Lc=re−ri, m, Smzz: axial stress, MPa,
$\sigma_{seuil}$: threshold stress equal to 1 MPa,
p: cumulative plastic deformation,
pmax: maximum value attained by p during the simulation,
$p_0$: constant equal to 1.

2. The method according to claim 1, further comprising, after the calculation of simulated pore plugging coefficient $F_{num}$, calculating a simulated mass leakage flow rate $Q_{mnum}$ of a fluid within a space sealed by the seal, such that:

$$Q_{mnum} = \frac{\pi \cdot M}{\mu \cdot R \cdot T \cdot F_{num}}(Pe^2 - Pi^2),$$

where
M: molar mass of the fluid, kg/mol
μ: dynamic viscosity of the fluid, Pa·s R=8.314 J/K/mol T: temperature of the fluid, K
Pi: pressure in the space which has been sealed, Pa
Pe: pressure outside the space which has been sealed, Pa.

3. The method according to claim 1, further comprising, when the values of coefficients λ, α and β are unknown for a material of the seal, a determination of the values of coefficients λ, α and β corresponding to the material of the seal obtained by:
measuring a mass flow rate $Q_m$ of a fluid enabling the fluid to be kept at a roughly constant pressure Pi in a space sealed by a second seal comprising the material during a deformation by creep of the second seal by compression of the second seal between two surfaces,
calculating an experimental pore plugging coefficient $F_{exp}$, representative of tightness of the second seal at at least one interface between the second seal and one of the two surfaces, such that:

$$F_{exp} = \frac{\pi \cdot M}{\mu \cdot R \cdot T \cdot Q_m}(Pe^2 - Pi^2),$$

where
M: molar mass of the fluid, kg/mol
μ: dynamic viscosity of the fluid, Pa·s R=8.314 J/K/mol T: temperature of the fluid, K
$Q_m$: mass flow rate of the fluid, kg/s
Pi: pressure in the space which has been sealed, Pa
Pe: pressure outside the space which has been sealed, Pa,
and, after the calculation of simulated pore plugging coefficient $F_{num}$, calculating the values of coefficients λ, α and β made by minimizing the difference between the values of coefficients $F_{num}$ and $F_{exp}$.

4. The method according to claim 3, wherein the calculation of the values of coefficients λ, α and β is made by applying a method of least squares.

5. The method according to claim 3, wherein the measurement of mass flow rate $Q_m$ is obtained by:
  raising a temperature of the second seal and of the surfaces;
  bringing the surfaces into contact against the second seal and subjecting them to pressure;
  maintaining pressure exerted by the surfaces against the second seal;
  reducing pressure exerted by the surfaces against the second seal; and
  separating at least one of the surfaces and the second seal.

6. The method according to claim 5, wherein the raising the temperature is implemented until a temperature of between approximately 600° C. and 1000° C. is reached, and/or in which the pressure exerted by the surfaces on the second seal during the maintaining the pressure is equal to a force exerted by at least one of the surfaces on the second seal between approximately 3 N/mm and 10 N/mm, and/or in which the maintaining the pressure exerted by the surfaces on the second seal is implemented during a period of between approximately 5 hours and 15 hours.

7. The method according to claim 1, wherein the digital simulation is performed using a finite element mechanical calculation application.

8. The method according to claim 1, further comprising, prior to the digital simulation, measuring, by laser profilometry, a profile of the seal and/or of the surfaces, wherein a digital mesh of the seal and/or of the surfaces, used in the course of the digital simulation, is produced from the measured profile of the seal and/or of the surfaces.

9. The method according to claim 1, wherein the contact length Lc is obtained by calculating, by polynomial extrapolation of axial stress Smzz expressed in terms of a position at the interface between the seal and the one of the two surfaces, values of two abscissae corresponding to the maximum value divided by 10 of axial stress Smzz, where the contact length Lc is equal to the difference between the values of the two abscissae.

10. A device for estimating the tightness of a seal, comprising a computer configured to perform a method for estimating the tightness of a seal according to claim 1.

11. A non-transitory computer readable medium including a computer executable code that, when executed by a computer, causes the computer to perform a method for estimating the tightness of a seal according to claim 1.

* * * * *

UNITED STATES PATENT AND TRADEMARK OFFICE
CERTIFICATE OF CORRECTION

| | | |
|---|---|---|
| PATENT NO. | : 9,465,895 B2 | Page 1 of 1 |
| APPLICATION NO. | : 14/003653 | |
| DATED | : October 11, 2016 | |
| INVENTOR(S) | : Laurent Peigat et al. | |

It is certified that error appears in the above-identified patent and that said Letters Patent is hereby corrected as shown below:

On the Title Page

Item (54), and in the Specification, Column 1, Line 1, should read:
-- METHOD FOR ESTIMATING THE TIGHTNESS OF A SEAL --

Signed and Sealed this
Fourth Day of December, 2018

Andrei Iancu
*Director of the United States Patent and Trademark Office*